(12) United States Patent
Shih

(10) Patent No.: US 7,098,062 B2
(45) Date of Patent: Aug. 29, 2006

(54) MANUFACTURING METHOD OF PIXEL STRUCTURE OF THIN FILM TRANSISTOR LIQUID CRYSTAL DISPLAY

(75) Inventor: Ming-Hung Shih, Taoyuan (TW)

(73) Assignee: Quanta Display Inc., Taoyuan (TW)

( * ) Notice: Subject to any disclaimer, the term of this patent is extended or adjusted under 35 U.S.C. 154(b) by 16 days.

(21) Appl. No.: 10/907,050

(22) Filed: Mar. 17, 2005

(65) Prior Publication Data

US 2006/0141643 A1    Jun. 29, 2006

(30) Foreign Application Priority Data

Dec. 24, 2004 (TW) ............................ 93140419 A

(51) Int. Cl.
*H01L 21/00* (2006.01)
(52) U.S. Cl. ............................ 438/30; 438/149; 257/72
(58) Field of Classification Search .................. 438/30, 438/149
See application file for complete search history.

(56) References Cited

U.S. PATENT DOCUMENTS 6,999,152 B1 *   2/2006   Park et al. .................. 349/187
7,005,331 B1 *   2/2006   Chen ........................... 438/158

* cited by examiner

*Primary Examiner*—Thao P. Le
(74) *Attorney, Agent, or Firm*—Jiang Chyun IP Office

(57) ABSTRACT

A method of fabricating a pixel structure of TFT LCD is provided. First, a gate pattern, pixel electrode pattern, gate isolating layer and semiconductor layer are formed over the substrate sequentially. Then, a patterning process is performed to remove the first metal layer over the pixel electrode pattern, wherein the gate isolating layer and semiconductor layer are retained over the gate pattern. Next, a source pattern and drain pattern are sequentially formed over the substrate, and then a passivation layer and photoresist layer are formed over the substrate. Thereafter, a back side exposure process and a patterning process are performed by using the gate pattern, source pattern and drain pattern as mask to pattern the photoresist layer. Thereafter, the passivation layer is etched by using the patterned photoresist layer as mask to expose the transparent conductive layer of the pixel electrode pattern. Finally, the photoresist layer is removed.

9 Claims, 6 Drawing Sheets

MANUFACTURING METHOD OF PIXEL STRUCTURE OF THIN FILM TRANSISTOR LIQUID CRYSTAL DISPLAY

CROSS-REFERENCE TO RELATED APPLICATION

This application claims the priority benefit of Taiwan application serial no. 93140419, filed Dec. 24, 2004.

BACKGROUND OF THE INVENTION

1. Field of the Invention

The present invention relates to a method of fabricating a thin film transistor liquid crystal display. More particularly, the present invention relates to a method of fabricating a pixel structure of a thin film transistor liquid crystal display.

2. Description of Related Art

Conventionally, thin film transistor (TFT) liquid crystal display (LCD) panel is mainly constructed by TFT array substrate, color filter array substrate and liquid crystal layer between the two substrates. In general, the TFT array substrate includes a plurality of pixels, wherein each pixel includes a TFT and a pair of pixel electrodes.

The process of fabricating the conventional pixel structure of TFT LCD usually includes five masking processes. In general, the first masking process is adopted for defining a first metal layer to form scan lines and gate component of thin film transistors. The second masking process is adopted for defining channel layer and ohmic contact layer of the thin film transistors. The third masking process is adopted for defining a second metal layer to form data lines and source/drain component of thin film transistors. The fourth masking process is adopted for patterning the passivation layer. The fifth masking process is adopted for patterning the transparent conductive layer to form the pixel electrodes.

Recently, the size of the TFT LCD panel is gradually increasing as the process fabricating of the TFT LCD is being progressively developed. However, a variety of problems such as the reduction in the fabrication yield and yield rate with the increasing size of the TFT LCD panel. It is noted that, these problems may be improved by simplifying the process. Therefore, it is highly desirable to reduce the number of masking processes of the TFT LCD, i.e., and thereby reduce the number of exposure processes and increase the yield rate, and to reduce the fabrication time and the fabrication cost.

SUMMARY OF THE INVENTION

Therefore, the present invention is directed to a method of fabricating a pixel structure of a thin film transistor (TFT) liquid crystal (LCD), wherein only three masking processes may be implemented to fabricate of the pixel structure.

According to one embodiment of the present invention, the method of fabricating a pixel structure of a TFT LCD comprises, for example, the following steps. First, a transparent conductive layer and a first metal layer are sequentially formed over a substrate. Then, a first masking process is performed for patterning the first metal layer and the transparent conductive layer to define a gate pattern and a pixel electrode pattern. Next, a gate isolating layer and a semiconductor layer are sequentially formed over the substrate for covering the gate pattern and the pixel electrode pattern described above. Thereafter, a second masking process is performed for retaining the gate isolating layer and the semiconductor layer over the gate pattern and removing the first metal layer of the pixel electrode pattern. Then, a second metal layer is formed over the substrate, and a third masking process is performed for patterning the second metal layer and forming a source pattern and a drain pattern over the retained semiconductor layer. Next, a passivation layer is formed over the substrate, and then a photoresist layer is formed over the passivation layer. Thereafter, a back side exposure process and a patterning process are performed by using the gate pattern, the source pattern and the drain pattern as a mask for patterning the photoresist layer. Thereafter, an etching step is performed for etching the passivation layer by using the patterned the photoresist layer as a mask to expose the transparent conductive layer of the pixel electrode pattern. Thereafter, the photoresist layer is removed.

Accordingly, in the method of fabrication the pixel structure, according to an embodiment of the present invention described above, only requires, for example but not limited to, three masking processes to fabricate the pixel structure compared to the conventional method where five masking processes are required. Thus, it is possible at least save two masking processes and thereby effectively increase the fabrication yield rate and reduce the fabrication cost.

One or part or all of these and other features and advantages of the present invention will become readily apparent to those skilled in this art from the following description wherein there is shown and described one embodiment of this invention, simply by way of illustration of one of the modes best suited to carry out the invention. As it will be realized, the invention is capable of different embodiments, and its several details are capable of modifications in various, obvious aspects all without departing from the invention. Accordingly, the drawings and descriptions will be regarded as illustrative in nature and not as restrictive.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

The present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

In one embodiment of the present invention, the method of fabricating a pixel structure of a TFT LCD may comprise, for example but not limited to, three masking processes. In addition, the substrate including a plurality of pixel structures provided by the present invention may be assembled with any color filter substrate and liquid crystal layer to construct a TFT liquid crystal display panel. Hereinafter, exemplary embodiments will be described for illustrating the present invention, however, these embodiments can't be used to limit the scope of the present invention.

Figure 1:
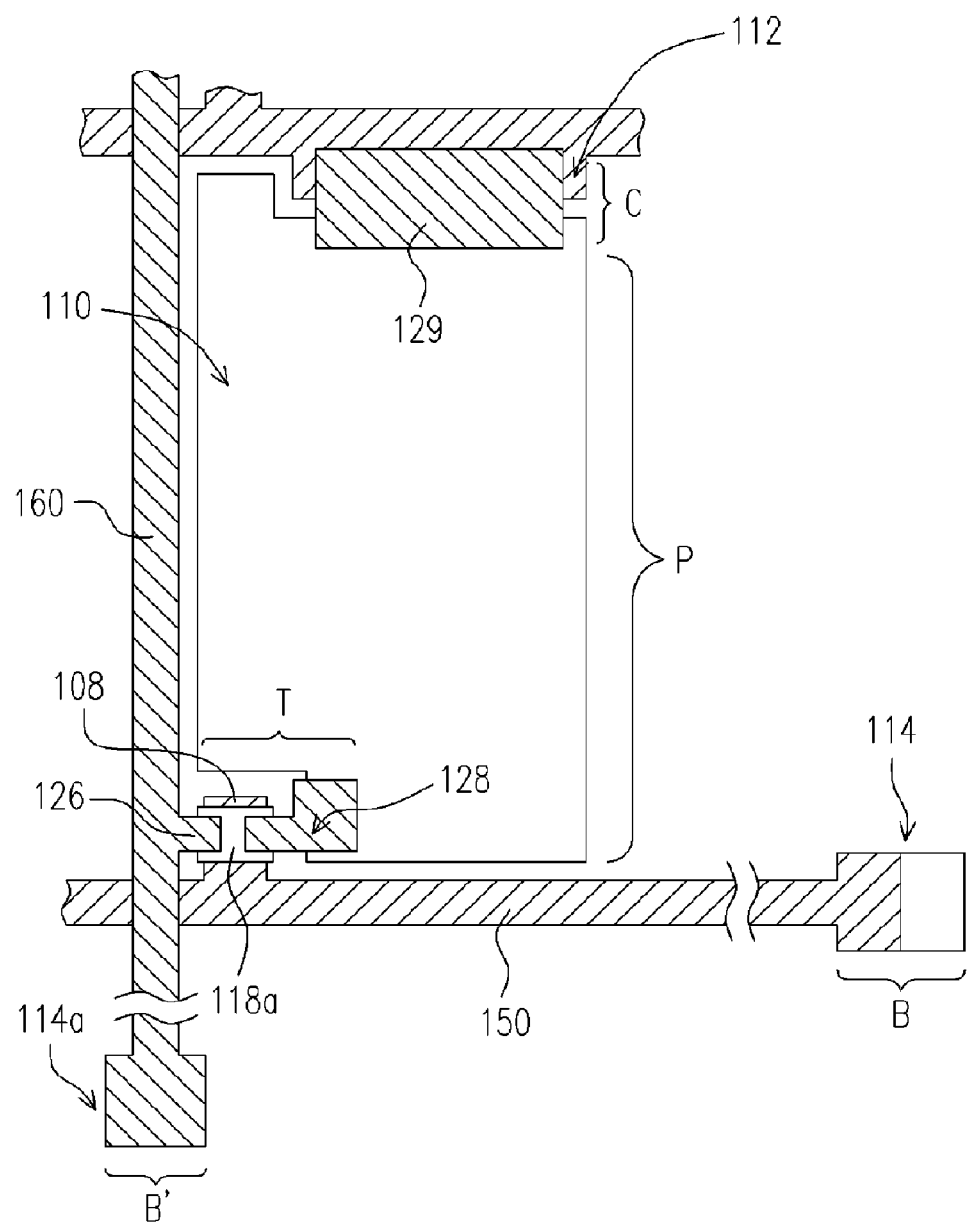
FIG. 1 is a schematic top view of a pixel structure of a TFT LCD according to one embodiment of the present invention.
Figure 2A:
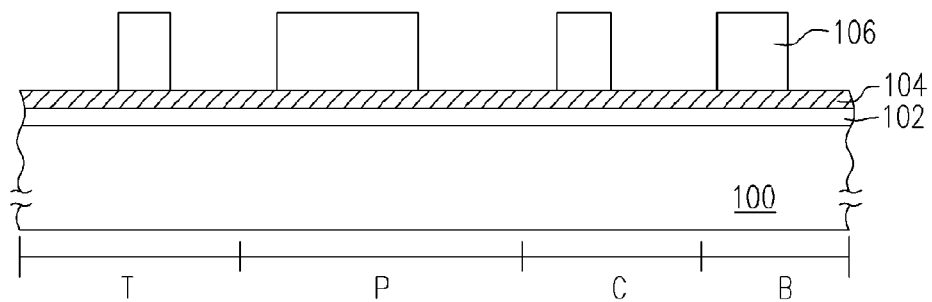
FIG. 2A to FIG. 2K are schematic cross-sectional views illustrating a process flow chart for fabricating a pixel structure of a TFT LCD according to one embodiment of the present invention.

FIG. 1 is a schematic top view of a pixel structure of a TFT LCD according to one embodiment of the present invention. FIG. 2A to FIG. 2K are schematic cross-sectional views illustrating a process flow chart of a method for fabricating a pixel structure of a TFT LCD according to one embodiment of the present invention. Referring to FIG. 1 and FIG. 2A, a transparent conductive layer 102 and a first metal layer 104 are formed over a substrate 100 sequentially. In one embodiment of the present invention, the first metal layer 104 may comprise a single metal layer or a multilayer metal layer structure. The material of the single metal layer may comprise chromium (Cr), tungsten (W), tantalum (Ta), titanium (Ti), molybdenum (Mo), aluminum (Al) or the alloy of these metal materials. The multilayer metal layer structure may comprise Al/Cr/Al composite layer structure, Mo/Al/Mo composite layer structure, Cr/Al composite layer structure or other metal composite layer structure comprising materials described above. In addition, the pixel structure of the substrate 100 may comprise a predetermined region for forming the thin film transistor, a region for forming a pixel electrode P, a region for forming a storage capacitor C and a region for forming bonding pads B and B'. The substrate 100 may comprise a transparent glass substrate or a transparent plastic substrate. The material of the transparent conductive layer 102 may comprise metal oxide, for example but not limited to, indium tin oxide (ITO), indium zinc oxide (IZO) or other transparent metal oxide. Specially, if the material of the transparent conductive layer 102 is ITO or IZO, the preferable material of the single metal layer or the multilayer metal structure of the first metal layer 104 may be selected from chromium (Cr), tungsten (W), tantalum (Ta), titanium (Ti), molybdenum (Mo), or the alloy of these metal materials which has a better contact with the transparent conductive layer 102.

Figure 2B:
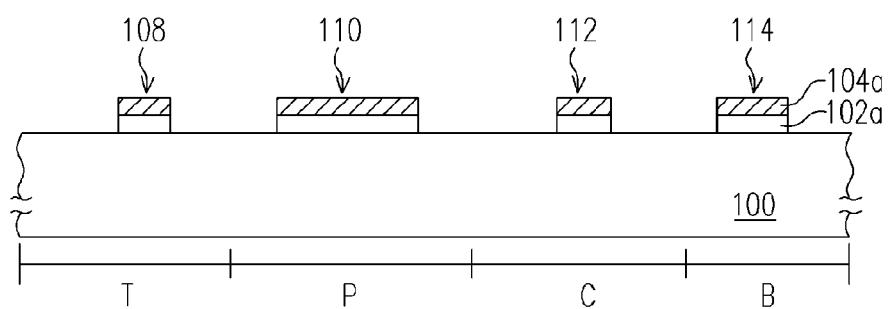

Thereafter, a first masking process is performed to form a patterned photoresist layer 106 over the first metal layer 104. Thereafter, an etching process is performed by using the photoresist layer 106 as an etching mask for patterning the first metal layer 104 and the transparent conductive layer 102 to form a patterned first metal layer 104a and a patterned transparent conductive layer 102a as shown in FIG. 2B. In one embodiment of the present invention, the first masking process may be adopted for defining a gate pattern 108 in a predetermined region for forming the TFT T, for defining a pixel electrode pattern 110 in a predetermined region, for forming a pixel electrode P, and for defining the scan line 150 being electrically connected with the gate pattern 108 (as shown in FIG. 1).

In one embodiment of the present invention, a bottom electrode pattern 112 may be further defined in a predetermined region for forming the storage capacitor C. In addition, the storage capacitor C may comprise storage capacitor on gate (Cs on gate). In one embodiment of the present invention, the first masking process may further define a bonding pad pattern 114 electrically connected with the scan line 150 in a predetermined region for forming the bonding pad B on the edge of the substrate 100. In addition, the first masking process may further define an independent bonding pad pattern 114a (having a same or similar cross-section with the bonding pad B) in a predetermined region for forming the bonding pad B' on another edge of the substrate 100. In another embodiment of the present invention, the first masking process may further define a bottom electrode pattern 112 and the bonding pad pattern 114.

Figure 2C:
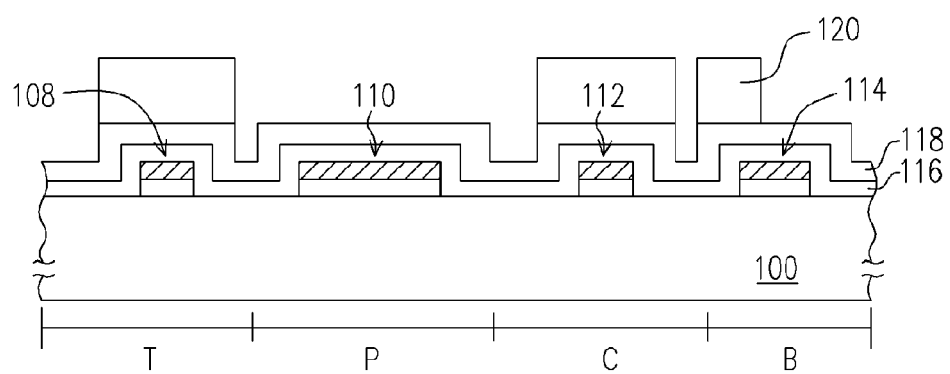

Referring to FIGS. 1 and 2C, a gate isolating layer 116 and a semiconductor layer 118 may be sequentially formed over the substrate 100 for covering the structure described above. In one embodiment of the present invention, the material of the gate isolating layer 116 may comprise, silicon nitride, silicon oxide or silicon oxynitride (SiON). The semiconductor layer 118 may comprise a channel material layer (for example but not limited to, an amorphous silicon (a-Si) layer) and an ohmic contact material layer (for example but not limited to, a doped amorphous silicon (a-Si) layer).

Figure 2D:
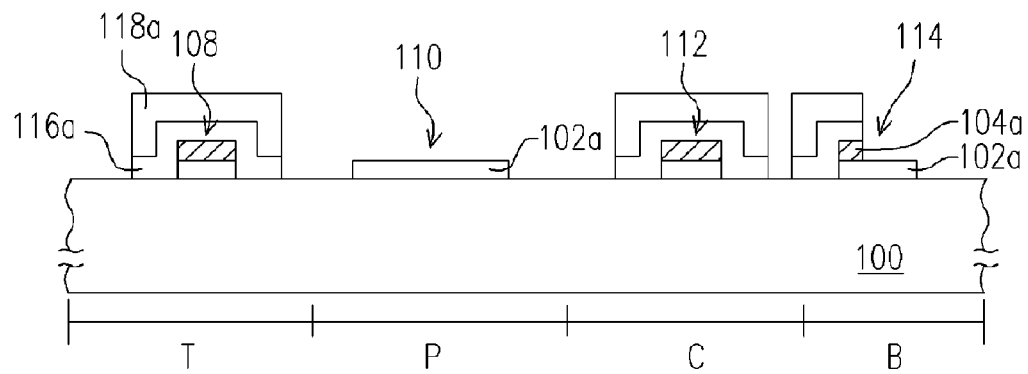

Thereafter, a second masking process may be performed for forming a patterned photoresist layer 120 over the semiconductor layer 118. Then, as shown in FIG. 2D, an etching process is performed for patterning the semiconductor layer 118 and the gate isolating layer 116 by using the photoresist layer 120 as an etching mask. Therefore, a patterned semiconductor layer 118a and a gate isolating layer 116a may be formed, and the first metal layer 104 over the pixel electrode pattern 110 is also removed and the transparent conductive layer 102a of the pixel electrode pattern 110 is retained. In one embodiment of the present invention, after the second masking process, the semiconductor layer 118a and gate isolating layer 116a over the gate pattern 108 are retained.

In one embodiment of the present invention, after the second masking process, the semiconductor layer 118a and the gate isolating layer 116a over the bottom electrode pattern 112 may further be retained for serving as a capacitor dielectric layer. In another embodiment of the present invention, the second masking process may further remove portions of the semiconductor layer 118a, the gate isolating layer 116a over the bonding pad patterns 114 and 114a, and the first metal layer 104a of the bonding pad patterns 114 and 114a. Therefore, the transparent conductive layer 102 of the bonding pad patterns 114 and 114a are exposed. In still another embodiment of the present invention, after the second masking process, the semiconductor layer 118a and the gate isolating layer 116a over the bottom electrode pattern 112 may be retained, and portions of the semiconductor layer 118a, the gate isolating layer 116a over the bonding pad patterns 114 and 114a, and the first metal layer 104a of the bonding pad patterns 114 and 114a, may be removed. Therefore, the transparent conductive layer 102 of the bonding pad patterns 114 and 114a are exposed.

Figure 2E:
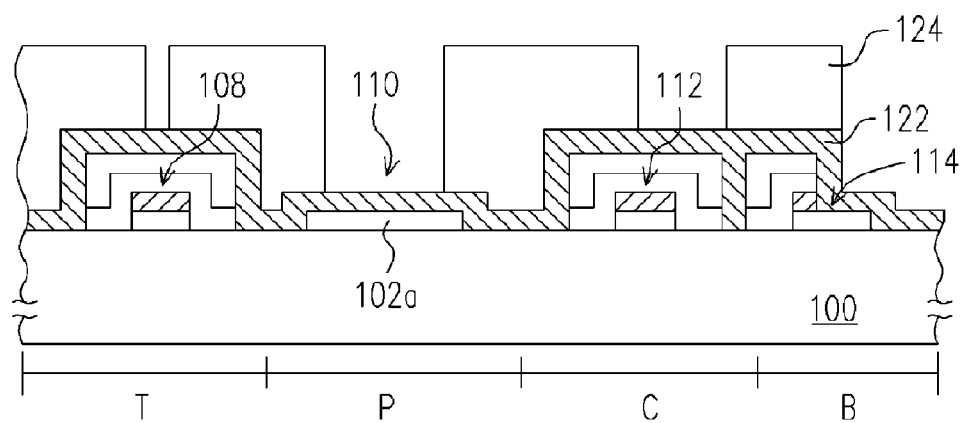

Referring to FIGS. 1 and 2E, a second metal layer 122 is formed over the substrate 100 for covering the structure described above. In one embodiment of the present invention, the second metal layer 122 may comprise a single metal layer or a multilayer metal layer structure. The material of the single metal layer may comprise chromium (Cr), tungsten (W), tantalum (Ta), titanium (Ti), molybdenum (Mo), aluminum (Al) or the alloy of these metal materials. The material of the multilayer metal layer structure may comprise Al/Cr/Al layer structure, Mo/Al/Mo layer structure, Cr/Al layer structure, or other combination layer structure of the metal materials described above.

Figure 2F:
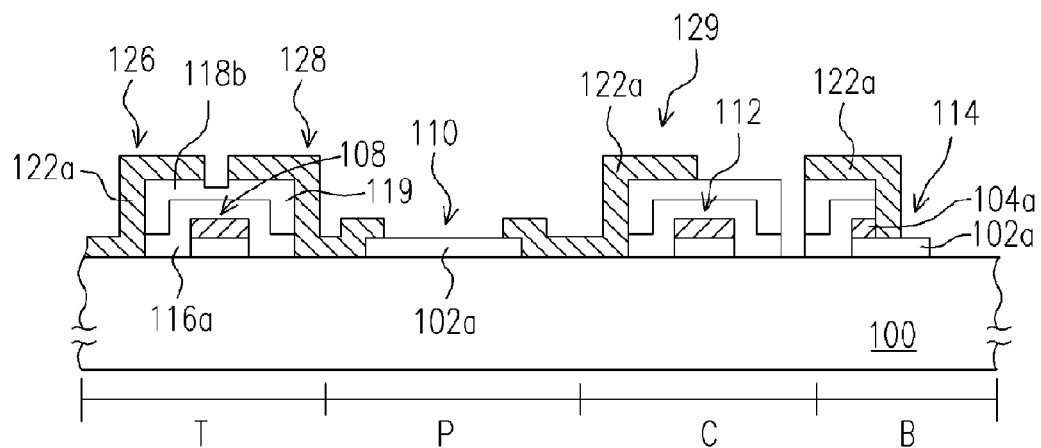

Thereafter, a third masking process is performed for forming a patterned photoresist layer 124 over the second metal layer 122. Thereafter, an etching process is performed by using the photoresist layer 124 as an etching mask for patterning the second metal layer 122 to form a patterned second metal layer 122a as shown in FIG. 2F. In one embodiment of the present invention, the second metal layer 122a formed over the gate pattern 108 may comprise a source pattern 126 and a drain pattern 128 respectively, wherein the drain pattern 128 may be electrically connected with the pixel electrode pattern 110. In another embodiment of the present invention, the third masking process may further define a data line 160 connected with the source pattern 126 (as shown in FIG. 1). In one embodiment of the present invention, as the second metal layer 122 is patterned, a top portion of the semiconductor layer 118*a* between the source pattern 126 and the drain pattern 128 may further be removed to form a semiconductor layer 118*b*, wherein a channel layer 119 is formed between the source pattern 126/drain pattern 128 and the gate pattern 108.

In one embodiment of the present invention, after the third masking process, a second metal layer 122*a* adjacent to and over the bottom electrode pattern 112 may be retained for serving the top electrode 129 of the pixel storage capacitor, wherein the top electrode 129 may be electrically contacted with the pixel electrode pattern 110. Thus, a pixel storage capacitor comprising the top electrode 129, the bottom electrode pattern 112, and the dielectric material (the gate isolating layer 116*a* and the semiconductor layer 118*a*) between the two electrodes is formed. In one embodiment of the present invention, after the third masking process, the second metal layer 122*a* over the bonding pad pattern 114 may be retained, wherein the second metal layer 122*a* may be electrically connected with the first metal layer 104*a* and the transparent conductive layer 102*a* of the bonding pad pattern 114. Therefore, the second metal layer 122*a* formed in the predetermined region for forming the bonding pad B' on the edge of the substrate 100 may be electrically connected to the data line 160, and may be adopted to serve as a portion of the bonding pad pattern 114*a*. In another embodiment of the present invention, the structure of the bonding pad B' may be similar to or same as that of the bonding pad B. In one embodiment of the present invention, after the third masking process, the second metal layer 122*a* over the bottom electrode pattern 112 and bonding pad pattern 114, 114*a* may be retained.

Figure 2G:
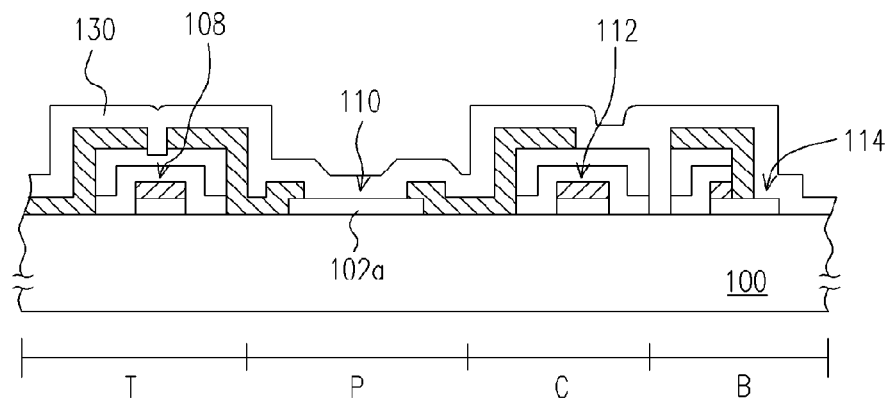

Referring to FIGS. 1 and 2G, a passivation layer 130 may be formed over the substrate 100 for covering the structure described above. In one embodiment of the present invention, the material of the passivation layer 130 may comprise silicon oxide, silicon nitride, silicon oxynitride (SiON) or organic material.

Figure 2H:
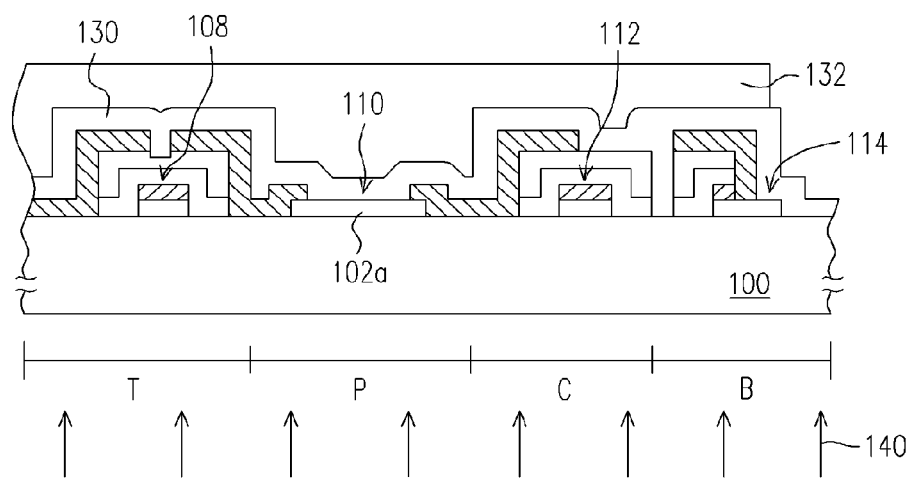
Figure 2I:
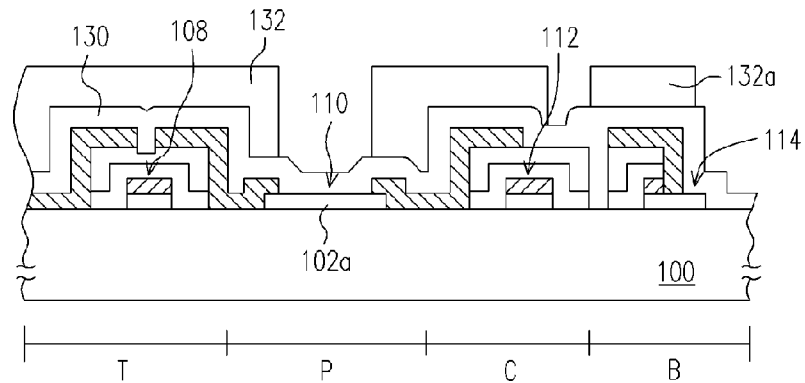
Figure 2J:
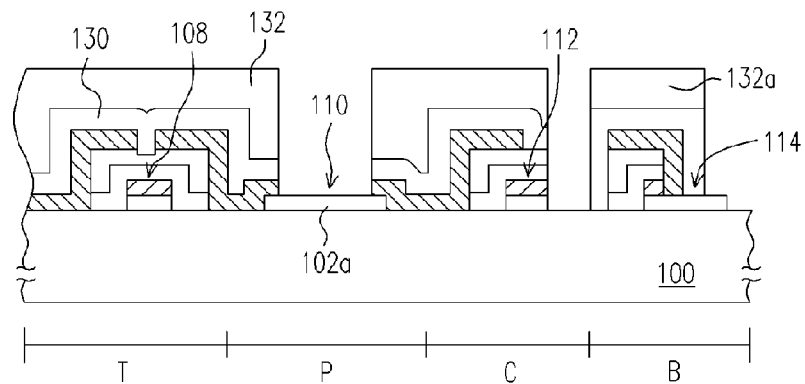
Figure 2K:
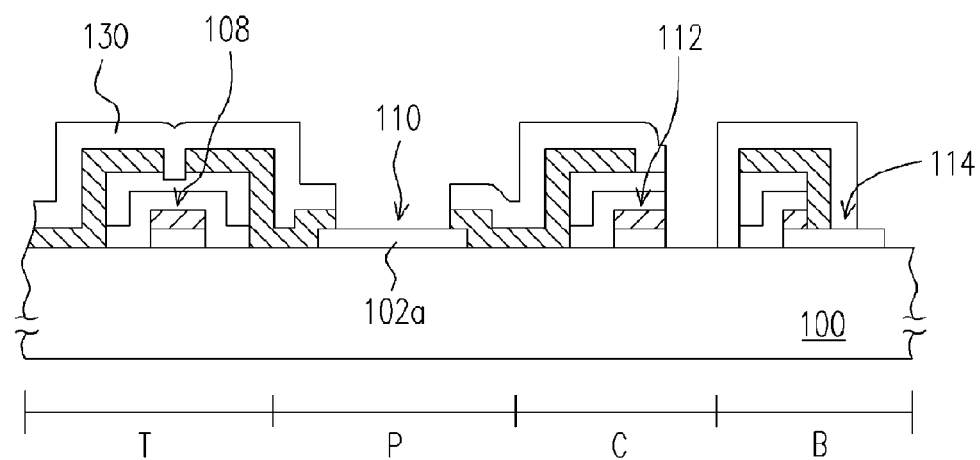

Referring to FIG. 2H, a photoresist layer 132 may be formed over the passivation layer 130. Thereafter, a back side exposure process 140 may be performed by using the gate pattern 108, the source pattern 126 and the drain pattern 128 as a mask. The light source of the back side exposure process 140 for exposure may be incident from the back side of the substrate 100. Thereafter, a patterning process is performed for patterning the photoresist layer 132 to form a patterned photoresist layer 132*a* as shown in FIG. 2I. Then, an etching process is performed by using the patterned photoresist layer 132*a* as an etching mask for patterning the passivation layer 130 to form the patterned passivation layer 130*a* as shown in FIG. 2J. Thereafter, the patterned photoresist layer 132*a* as shown in FIG. 2K is removed. In one embodiment of the present invention, the transparent conductive layer 102*a* of the pixel electrode pattern 110 is exposed by the patterned passivation layer 130*a*. In one embodiment of the present invention, a portion of the transparent conductive layer 102*a* of the bonding pad pattern 114, 114*a* may further be exposed by the patterned passivation layer 130*a*, and may be electrically connected to an external circuit.

Accordingly, the method of fabricating the pixel structure, according to an embodiment of the present invention, requires, for example but not limited to, three masking processes for fabricating the pixel structure compared to the conventional method where five masking processes are required, the present invention saves two masking processes. Therefore, the yield rate is increased, the fabrication time is reduced and the fabrication cost is reduced.

The foregoing description of the embodiment of the present invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A method of fabricating a pixel structure of a thin film transistor (TFT) liquid crystal (LCD), comprising:

sequentially forming a transparent conductive layer and a first metal layer over a substrate;

performing a first masking and pholithography process for patterning the first metal layer and the transparent conductive layer to define a gate pattern and a pixel electrode pattern;

sequentially forming a gate isolating layer and a semiconductor layer over the substrate for covering the gate pattern and the pixel electrode pattern;

performing a second masking process for removing the first metal layer of the pixel electrode pattern, wherein the gate isolating layer and the semiconductor layer retained over the gate pattern;

forming a second metal layer over the substrate;

performing a third masking process for patterning the second metal layer and forming a source pattern and a drain pattern over the retained semiconductor layer;

forming a passivation layer over the substrate;

forming a photoresist layer over the passivation layer;

performing a back side exposure process and a patterning process by using the gate pattern, the source pattern and the drain pattern as a mask for patterning the photoresist layer;

performing an etching step for etching the passivation layer by using the patterned the photoresist layer as a mask to expose the transparent conductive layer of the pixel electrode pattern; and removing the photoresist layer.

2. The manufacturing method of claim 1, further comprising:

defining a bottom electrode pattern during the first masking process;

retaining the gate isolating layer and the semiconductor layer over the bottom electrode pattern during the second masking process; and retaining the second metal layer over the semiconductor layer over the bottom electrode pattern during the third masking process to serve as a top electrode.

3. The manufacturing method of claim 1, further comprising:

defining a bonding pad pattern during the first masking process;

removing a portion of the first metal layer of the bonding pad pattern and retaining portions of the gate isolating layer and the semiconductor layer over the bonding pad pattern during the second masking process;

retaining the second metal layer over the bonding pad pattern during the third masking process; and removing a portion of the passivation layer over the bonding pad pattern during the step of etching the passivation layer.

4. The manufacturing method of claim 1, further comprising:

defining a bottom electrode pattern and a bonding pad pattern during the first masking process;

removing the first metal layer of a portion of the bonding pad pattern, retaining the gate isolating layer and the semiconductor layer over the bottom electrode pattern, and retaining portions of the gate isolating layer and the semiconductor layer over the bonding pad pattern during the second masking process;

retaining the second metal layer over the semiconductor layer during the third masking process to serve as a top electrode, and retaining the second metal layer over the bonding pad pattern; and removing a portion of the passivation layer over the bonding pad pattern during the step of etching the passivation layer.

5. The manufacturing method of claim 1, further comprising:

removing a top portion of the semiconductor layer between the source pattern and the drain pattern in the third masking process.

6. The manufacturing method of claim 1, wherein the first metal layer comprises a single metal layer, an alloy metal layer or a multilayer metal layer structure.

7. The manufacturing method of claim 1, wherein the second metal layer comprises a single metal layer, an alloy metal layer or a multilayer metal layer structure.

8. The manufacturing method of claim 1, wherein the semiconductor layer comprises a channel material layer or an ohmic contact material layer.

9. The manufacturing method of claim 1, wherein the transparent conductive layer comprises a metal oxide layer.

* * * * *